United States Patent

Pascente

[15] 3,668,422

[45] June 6, 1972

[54] SYNCHRONOUS SWITCHING CIRCUIT

[72] Inventor: Joseph E. Pascente, Norridge, Ill.

[73] Assignee: Grigsby-Barton, Inc., Rolling Meadows, Ill.

[22] Filed: Sept. 28, 1970

[21] Appl. No.: 76,132

[52] U.S. Cl. ..........................307/133, 307/252 B, 317/11 A

[51] Int. Cl. ..........................H01h 9/56

[58] Field of Search ..........................307/133, 232, 252 UA, 252 B; 323/22 R; 317/11 A

[56] References Cited

UNITED STATES PATENTS

| | | | |
|---|---|---|---|
| 3,526,790 | 9/1970 | Brookmire | 307/252 B |
| 3,360,713 | 12/1967 | Howell | 307/252 B |
| 3,515,902 | 6/1970 | Howell | 307/252 B |
| 3,463,933 | 8/1969 | Kompelien | 307/133 |
| 3,390,275 | 6/1968 | Baker | 307/133 X |
| 3,443,204 | 5/1969 | Baker | 307/133 |

*Primary Examiner*—Robert K. Schaefer
*Assistant Examiner*—William J. Smith
*Attorney*—Fitch, Even, Tabin & Luedeka

[57] ABSTRACT

Switching circuits for controlling the application of an A.C. source to a load employ a zero voltage crossing detector for selectively triggering a control thyristor at a zero voltage crossing of the source and means for supplying a continuous latch current to the gate of the control thyristor during succeeding cycles of the A.C. source. The control thyristor is employed to latch a switching thyristor which, in turn, applies the power from the A.C. source to the load.

17 Claims, 3 Drawing Figures

Inventor
Joseph E. Pascente

Anderson, Luedeka, Fitch, Even & Tabin
Attys.

Inventor
Joseph E. Pascente
Anderson, Luedeka, Fitch, Even & Tabin Attys

Inventor
Joseph E. Pascente

Anderson, Luedeka, Fitch, Even & Tabin
Attys.

SYNCHRONOUS SWITCHING CIRCUIT

The present invention relates to zero voltage A.C. switching circuits, and particularly to such circuits employing a triac or other thyristor element or elements arranged for bidirectional operation.

Zero voltage or synchronous switching circuits generally employing thyristor elements for applying power to a load at zero voltage and removing power from the load at zero current are now well known. However, such circuits as have been heretofore proposed have generally presented problems when used with certain types of loads. In particular, these circuits have generally presented problems in switching highly reactive loads, as well as in switching resistive or reactive loads which draw either extremely high current or extremely low current relative to the normal ratings of economically practicable and available thyristors. Various problems associated with the switching of reactive loads are discussed at some length in available publications, such as the General Electric SCR Manual, 4th Edition, 1967. The problems associated with the switching of extremely high current loads arise because thyristors, such as triacs, which have high load terminal current ratings also require high gate currents for firing, and such gate currents have usually been obtained only by providing additional amplification stages in the zero voltage switching circuit, adding to the cost and complexity of the circuit. On the other hand, the switching of low load currents raises the problem of the thyristor becoming nonconductive or turning off when the load current is almost equal to the latching current rating of the thyristor.

In many applications the triac of an A.C. zero voltage switching circuit is required to turn on a load that initially draws a relatively low current, such as less than 1.0 amp., but which load may later increase to a high current, such as 15.0 amps. Since, typically, the higher the average load current rating of a thyristor, the higher will be the latch current, such a load would normally present serious problems in achieving zero voltage switching with heretofore existing circuits.

Accordingly, it is an object of the present invention to provide an improved zero voltage switching circuit which may be utilized to readily switch either high or low current loads, or loads which draw varying currents from one extreme to the other.

It is another object of the present invention to provide an improved zero voltage switching circuit which has the capability of supplying relatively large gate currents to a thyristor having a high load current rating without the employment of additional stages of gate current amplification.

It is a further object of the present invention to provide such an improved zero voltage switching circuit as above described having the capability of reliably switching loads producing large reactive components of current.

These and other objects and advantages of the present invention are more particularly set forth in the following detailed description, and in the accompanying drawings, of which:

Figure 1:
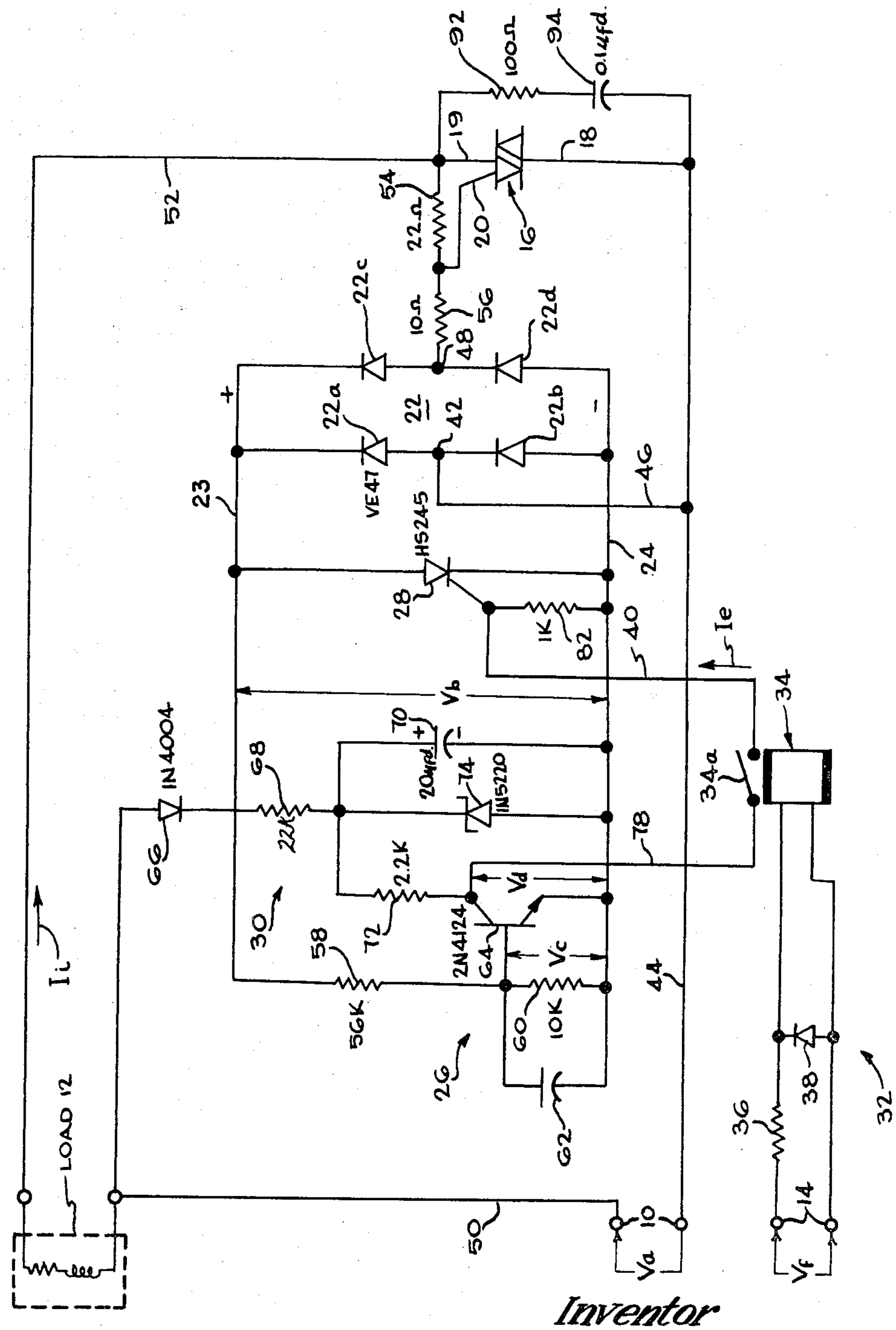
FIG. 1 is a schematic diagram of a zero voltage switching circuit in accordance with a preferred embodiment of the present invention.

Generally, referring to FIG. 1, there is shown a switching circuit for controlling the application of an A.C. voltage source $V_a$ from line terminals 10 to a load impedance 12, illustrated as having resistance and inductive reactance, in response to a control command signal $V_f$ applied to circuit control terminals 14 for actuation and deactuation of the circuit. Switching thyristor means, illustrated as triac 16, having a pair of load terminals, shown as anode 18 and cathode 19 (by analogy to SCR convention), and a control gate terminal 20, has its load terminals 18 and 19 connected in series with the A.C. source at line terminals 10 and the load 12, and is switchable from a normally nonconductive or "off" state to a conductive or "on" state by an appropriate firing signal applied between the thyristor gate terminal 20 and one of its load terminals with proper potential applied across both load terminals. To remain in the conductive state without further firing or gate input, such thyristors must generally have a current flowing between their load terminals which is at least as great, and preferably greater, than the rated latch current of the thyristor. Otherwise, the thyristor will be "starved off" and will return to its normally nonconductive state. To prevent this from occurring, circuit means to be hereinafter described provide positive latching of the thyristor by effectively coupling its gate terminal to the line voltage applied to the appropriate thyristor load terminal, such as its anode.

The circuit means for operating the switching triac 16 comprises a rectifier means 22 for deriving a rectified D.C. voltage $V_b$ across circuit leads 23 and 24 from the A.C. source voltage $V_a$, means illustrated as synchronous detector 26 for normally providing a signal $V_d$ indicative of zero voltage crossings of the A.C. source voltage $V_a$, and a control thyristor illustrated as silicon controlled rectifier (SCR) 28 having its anode and cathode load terminals respectively connected across circuit leads 22 and 24 and which is selectively responsive to the application of the zero voltage detection signal supplied to its gate terminal for triggering the SCR to its conductive state. The operating circuit is coupled to the triac 16 through the rectifier means 22 which also functions as a means for steering the current in the appropriate manner to achieve the desired switching operation, as will be hereinafter explained.

Additionally, current supply means 30 is provided for supplying a continuous gate current $I_e$ to the SCR 28, during all succeeding cycles of the source voltage $V_a$, once the SCR 28 is triggered by the zero voltage detection signal $V_d$, to ensure positive latching of the SCR in its conductive state. Switching means 32 is responsive to the command control signal $V_f$ for selectively applying or removing the zero voltage detection signal and the continuous gate current to or from the gate of the SCR 28, resulting in the respective actuation and deactivation of the circuit. Consequently, in the illustrated embodiment, the command signal voltage $V_f$ applied to control terminals 14, regardless of when applied, causes the triac 16 to turn on at the next zero voltage crossing of the source, and results in the power being applied to the load 12 at that time. Removal of the command signal voltage $V_f$ at any time causes the triac 16 to turn off when the succeeding cycle of load current goes to zero (or becomes less than the minimum holding current rating of the triac).

More particularly, the control switching means 32 comprises a D.C. reed relay 34 having its coil connected in series with a voltage-dropping resistor 36 and the control terminals 14. A diode 38 may be optionally provided in parallel with the relay coil and poled to be normally reverse biased for dissipation of reverse polarity voltage transients which may occur across the relay coil on removal of the command signal voltage $V_f$. The reed relay 34 is of the normally open single pole, single throw type having its switch contacts 34a serially connected in the gate input lead 40 to the SCR 28. Thus, when the command signal voltage $V_f$ is zero, as shown at time zero in FIG. 2F, and with the A.C. source voltage $V_a$, as shown in FIG. 2A, applied to line terminals 10, the line voltage is applied across the rectifier means 22. Rectifier means 22 comprises a full wave rectifier bridge formed by diodes 22a through 22d and provides full wave rectified D.C. pulses across leads 23 and 24 which are respectively connected to the plus and minus terminals of the bridge, as shown. The line voltage $V_a$ is applied to one input terminal 42 of the bridge through a direct conductive connection via A.C. reference leads 44 and 46, and to the opposite input terminal 48 of the bridge via A.C. line lead 50, load 12 and load lead 52, as well as through coupling resistor 54 between the gate and cathode of the triac and the current limiting resistor 56. The resulting full wave rectified voltage $V_b$ is shown in FIG. 2B and appears across the anode and cathode of SCR 28 and the synchronous detector circuit 26.

More specifically, the synchronous detector circuit 26 comprises a voltage divider formed by resistors 58 and 60 which is connected across circuit leads 23 and 24, and thus has the full wave rectified voltage $V_b$ applied thereto. A capacitor 62 is connected in shunt with resistor 60, and the divided voltage $V_c$ thereacross is applied to the base-emitter circuit of an NPN-transistor 64. The emitter of the transistor 64 is connected directly to the lead 24 which forms the common or reference lead of the operating circuit for the switching triac 16. The collector of the transistor 64 is connected to the current supply means 30 which comprises a rectifier diode 66 serially connected with a current limiting resistor 68 and a storage capacitor 70, the series combination being connected from the line terminal 10 that is common to the load 12 to the operating circuit reference lead 24. The rectifier diode 66 is poled to provide a positive polarity voltage on the capacitor 70 with respect to the reference lead 24. A coupling resistor 72 applies the positive voltage developed across the capacitor at its junction with the limiting resistor 68 to the collector of the transistor 64. A Zener diode 74 is connected in shunt with the capacitor 70 as a protective device for preventing excessive voltages from developing on the capacitor 70 or from being applied across the transistor 64, especially when or if the load 12 were removed while the source voltage was applied to the line terminals 10.

Consequently, the divided full wave rectified voltage $V_c$ appearing across the base-emitter circuit of the transistor 64 is clipped by the action of the base-emitter junction to produce the modified waveform shown in FIG. 2C. The collector-emitter circuit of the transistor 64 thus conducts during the major portion of each half-cycle of the source, and becomes nonconductive only during the small time interval at each half-cycle of the zero source voltage crossing when the base-emitter voltage falls below the cut-off voltage of the transistor. This cut-off voltage may typically be about 0.7 volts, and so the transistor 64 will be nonconductive symmetrically with respect to time about each zero voltage crossing, as indicated by the downward peaks 75 in the wave form of FIG. 2C.

The zero voltage detector signal $V_d$ is taken across the collector-emitter circuit of the transistor 64. As shown in FIG. 2D, this signal is zero when the transistor 64 is conducting and is at a positive voltage (limited by the Zener diode 74) when the transistor 64 is not conducting. Thus, low voltage pulses 76 (e.g., from 6 to 16 volts, depending on the particular components employed in the circuit) will be produced on output lead 78 connected to the collector of transistor 64. The zero voltage crossing detector pulses 76 occur simultaneously with the downward peaks 75 previously described in connection with the base-emitter voltage waveform illustrated in FIG. 2C.

The charge storage capacitor 70 is charged on every alternate half-cycle through a charging circuit including lead 50 connected to one of the line terminals 10, diode 66, resistor 68, reference lead 24, diode 22*b*, lead 46, and A.C. reference lead 44 connected to the other one of the line terminals 10. In this condition of the circuit, the control SCR 28 is in its nonconductive state, as is the switching triac 16, and thus no significant line current is supplied to the load 12.

When the command signal voltage $V_f$ is applied to terminal pair 14, such as the voltage pulse or step 80 in FIG. 2F, this voltage is applied to the coil of the relay 34 through the voltage dropping resistor 36, causing normally open contacts 34a to close thereby completing the circuit from the collector of transistor 64 to the gate of the SCR 28 via leads 78 and 40.

Although this circuit is closed on receipt of the command signal voltage 80, i.e., at a time coincident with the leading edge or step of the pulse, the SCR 28 does not fire or become conductive at this time. However, on the occurrence of the next successive zero voltage detector pulse 76′ which is applied to the gate of the SCR 28 across the gate resistor 82, the SCR 28 becomes conductive as the voltage across its anode and cathode terminals increases. Upon becoming conductive, the SCR 28 shorts out the voltage divider of the synchronous detector circuit 26, and thereby removes the base drive from the transistor 64. This causes the transistor 64 to become nonconductive, and continuous gate current will be supplied to the SCR 28 via leads 78 and 40 and through closed contact 34*a*. This provides a positive latch for all succeeding cycles of source voltage $V_a$, until the command voltage 80 returns to zero.

As can be seen from FIG. 2D, the zero detector pulse 76′ which initiated the firing of the SCR 28 immediately degrades when the transistor 64 is cut off, the residual pulse being produced by, among other things, the time constant of the base circuit components including capacitor 62 and resistor 60, but the capacitor 62 may be eliminated in some applications. The gate current for the positive latching action of the SCR 28 is shown at 84 in FIG. 2E. As there shown, the gate current rises as a step function and provides a hard drive to the gate of the SCR 28 across the gate resistor 82. It may, of course, also be seen from FIGS. 2B and 2C that the occurrence of the shorting out of the synchronous detector voltage divider by SCR 28 becoming conductive causes the voltage across leads 22 and 24 to become zero and the clipping action of the transistor 64 to be eliminated.

Referring again to FIG. 1, it can be seen that the gate latch current $I_e$ is supplied during one half of each cycle through diode 66, resistor 68 and resistor 72, while on the opposite alternate half-cycles the latch current $I_e$ is supplied from the stored charge in the capacitor 70, since the polarity of the diode 66 permits current to flow from the line only during alternate half-cycles. Thus, during the nonconduction of the diode 66, and during the zero crossing times when no power is available from the line, the capacitor 70, which maintains its charge as previously described, applies power to the gate of the SCR 28. During the half cycle intervals when the diode 66 is conducting, the gate current return path is formed by the cathode of the SCR 28 and the diode 22*b* to the A.C. reference line 44. On the alternate half-cycles when the diode 66 is blocked, the gate current return path is formed by the cathode of the SCR 28 through the circuit reference lead 24 and back to the negative side of the capacitor 70.

With the control SCR 28 conducting, the rectifier bridge 22 functions as a current steering means and provides a direct conductive connection from the current limiting resistor 56 to the A.C. line reference lead 44, thus, in effect, tying the gate 20 of the triac 16 to its anode, assuring that the triac will synchronously switch with the A.C. source voltage. It may be noted that one of the most simple circuits for utilizing triacs as static switches comprises a resistive coupling between the triac gate terminal and its anode.

More specifically, when the SCR 28 is in its conductive state, the triac gate current path is defined by lead 50 from one of the line terminals 10, through the load 12, lead 52, resistors 54 and 56, rectifier bridge 22, SCR 28, back through rectifier bridge 22 and then through lead 46 to the other line terminal 10 via lead 44. The bridge 22 steers the current appropriately so that when lead 52 is positive and lead 44 is negative, the current path is through diode 22*c*, SCR 28, and diode 22*b*. When lead 52 is negative and lead 44 is positive, the current path is formed by diode 22*a*, SCR 28, and diode 22*d*. Thus, it can be seen that the resistor 56 has a direct conductive path to the anode 18 of the triac 16 to which the line 44 is applied so long as the SCR 28 remains conductive.

Figure 2:
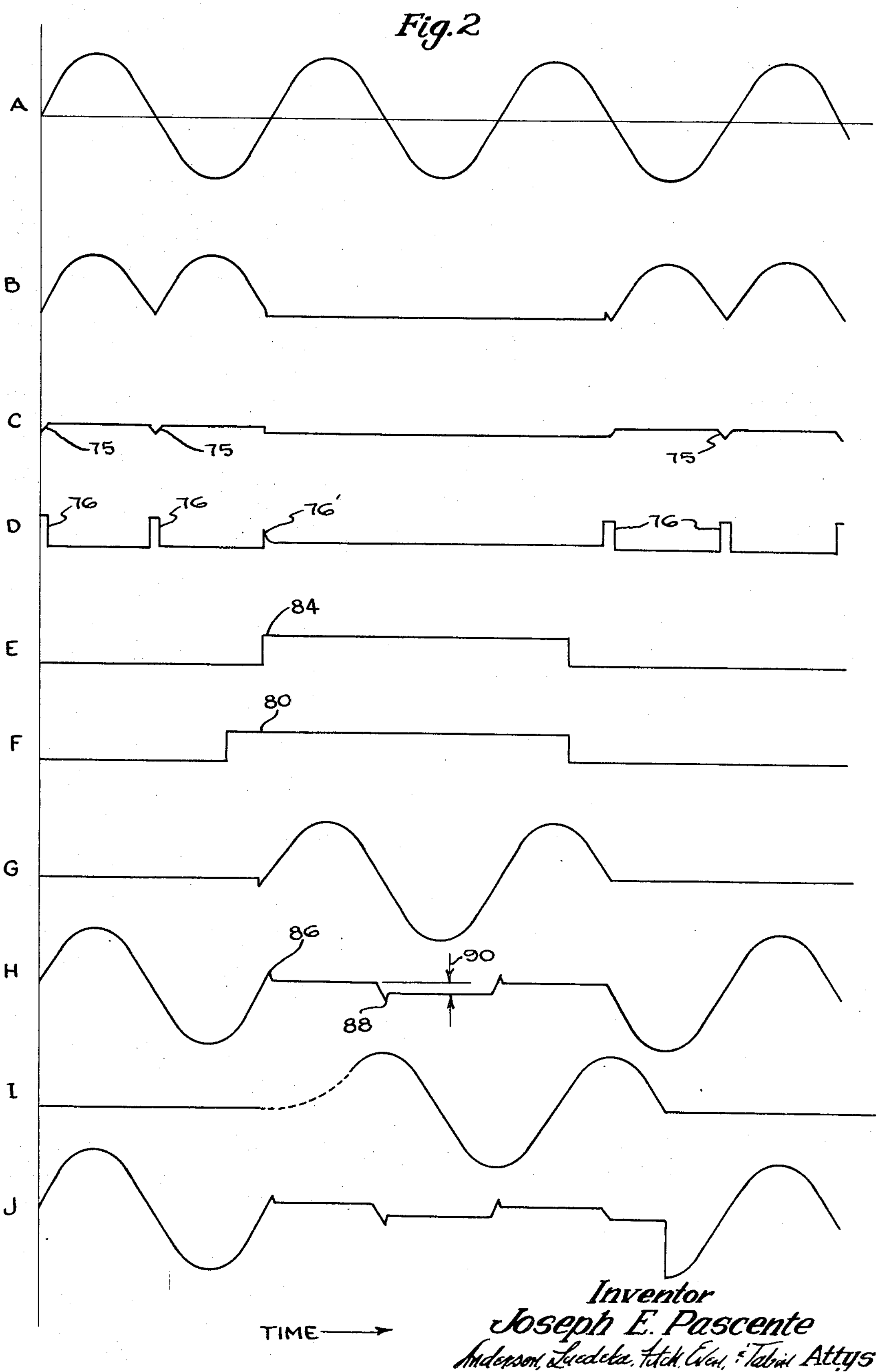
FIG. 2 is a graphical representation of voltages and currents with respect to time at various locations of the circuit of FIG. 1.

If load 12 were a pure resistive load, the waveform illustrated in FIG. 2G represents the voltage thereacross and the current therethrough. The waveform illustrated in FIG. 2H represents the voltage that will appear across the triac 16 for a purely resistive load. As shown in the waveform of FIG. 2H, small peaks 86 are formed by the latching and turn-off action of the triac. During the half-cycles of conduction of the triac, a voltage drop of typically one volt appears thereacross as indicated by 90 in FIG. 2H. It is, of course, understood that although the time scale of FIG. 2 corresponds for each of the waveforms, the amplitudes are not drawn at all to scale and the particular portions just referred to above are shown greatly magnified for clarity of illustration.

During the normal conduction and synchronous switching of the triac 16 substantially the full line voltage is applied to the load 12 through the triac. For the inductive load illustrated in FIG. 1, the power will be applied in the same manner as with a resistive load as previously discussed, but the turn-off or removal of power from the inductive load will occur later than the corresponding applied voltage cross-over point since a lagging load current will be produced. For a highly inductive load where the lagging current occurs approximately 90° after the applied voltage cross-over point, FIG. 2I illustrates the current waveform that results. FIG. 2J illustrates the corresponding voltage for such an inductive load which will be produced across the triac 16, being similar to that illustrated in FIG. 2H but having a lagging turn-off point.

When the command voltage 80, as shown in FIG. 2F, returns to zero, the reed relay contacts 34*a* open and thereby cut off the continuous supply of current to the gate of the SCR 28. As shown in FIG. 2E, the latch current $I_e$, as illustrated by 84, terminates abruptly and simultaneously with the termination of the command voltage 80. The SCR 28 will generally remain conductive for the remaining portion of that half-cycle, after which time it will become nonconductive and the full-wave rectified voltage produced by restifier bridge 22 will appear across leads 23 and 24 as shown in FIG. 2B. The clipped waveform of voltage $V_c$ will again appear across the base of transistor 64, as shown in FIG. 2C, and the zero detector pulses 76 will again appear at its collector on output lead 78, as shown in FIG. 2D. The triac 16 will become nonconductive again simultaneously with the SCR 28 returning to its nonconductive state and the load current will become substantially zero as shown in FIGS. 2G and I, corresponding, respectively, to resistive and inductive loads. The turn-off point for the inductive load as shown in FIGS. 2I and 2J will occur at a later time, as previously mentioned, due to the lagging nature of the inductive load current, and for nearly pure inductance would occur 90° out of phase to the source voltage. The lagging (or leading) load currents that may be produced do not prevent the circuits of the present invention from operating in synchronism with the source voltage.

A very small residual current continues to flow through the load even when the triac 16 is off, and this current is drawn through the bridge 22 by the synchronous detector circuit 26 in producing the pulses shown in FIG. 2D; however, this current is negligible in most applications and is of no concern. Removal of the load 12, however, will stop the operation of this circuit.

A series circuit formed by resistor 92 and capacitor 94 is connected in shunt with the triac 16 to minimize the *dv/dt*, and thus prevent the triac 16 from conducting at abrupt changes in voltage which may occur with various types of loads; however, this provision is in accordance with conventional practice for this purpose.

Specific circuits for operation at various voltages have been constructed in accordance with the embodiment of the invention illustrated in FIG. 1, and the component parameters and values specified in FIG. 1 provide satisfactory operation for line voltages of approximately 220 volts. Satisfactory operation at other line voltages, such as 20 volts, 420 volts, or at more than one voltage, may be achieved by suitably varying the component values in accordance with well known circuit design techniques.

Figure 3:
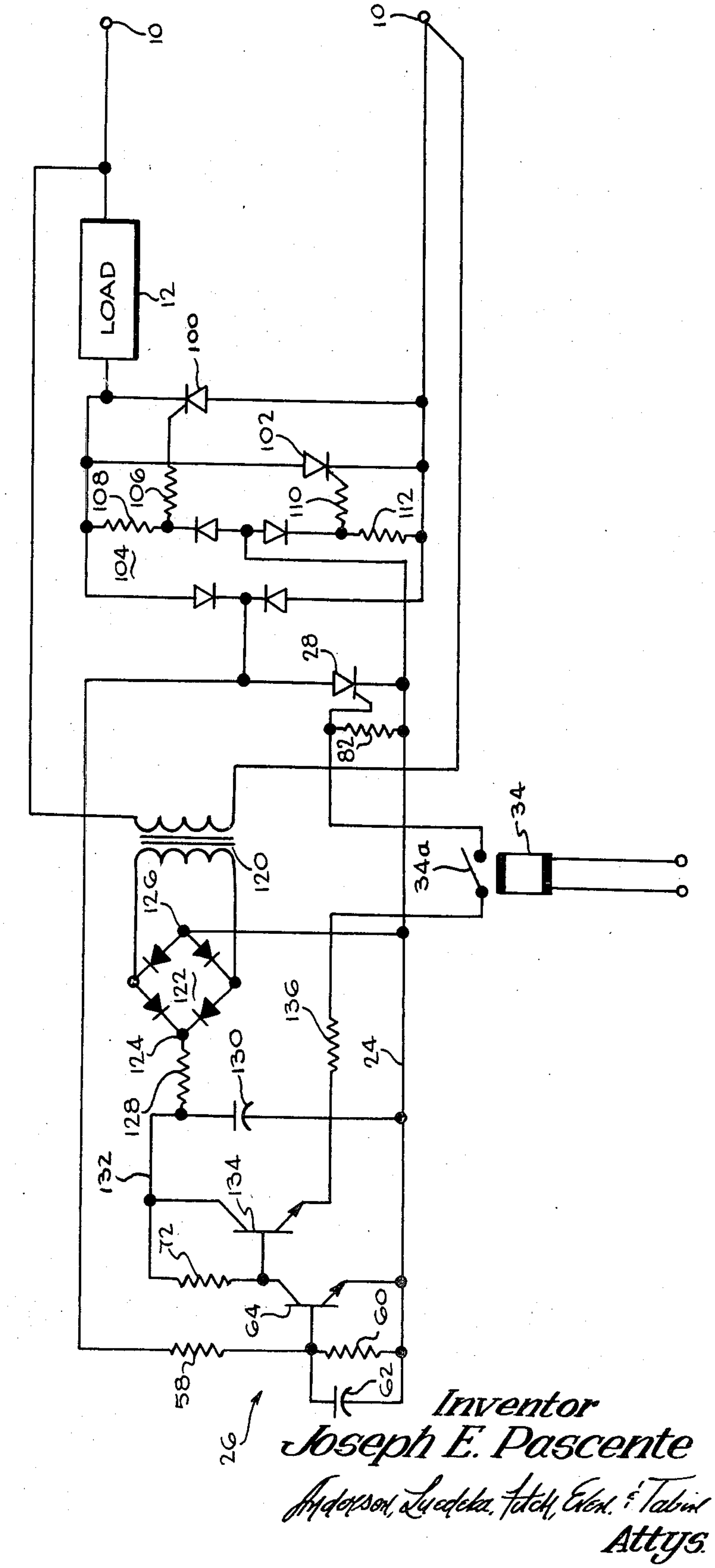
FIG. 3 is a schematic diagram of a zero voltage switching circuit in accordance with another embodiment of the invention.

FIG. 3 illustrates an alternative embodiment to the circuit shown in FIG. 1 wherein corresponding components are referenced with the same numerals. In particular, the circuit of FIG. 3 contains two principal differences from the circuit of FIG. 1. The first is that the switching thyristor means illustrated as the triac 16 in FIG. 1 comprises in FIG. 3 two inverse-parallel connected SCR's 100 and 102, each having their respective gate terminals connected to a rectifier means 104 through resistors 106 and 108 for the SCR 100 and resistors 110 and 112 for the SCR 102. This circuit may be employed for higher powers and for even greater or more severe load requirements.

Although the rectifier means 104 is arranged somewhat differently to that illustrated in FIG. 1 to accommodate the firing of the SCR's 100 and 102 in providing a bidirectional switching characteristic for the circuit, rectifier means 104 operates in essentially the same manner as was previously described in connection with the rectifier means 22. That is, it provides a rectified full wave D.C. voltage across the SCR 28 and the synchronous detector circuit 26, in addition to performing the current steering functions for latching the switching thyristors through the SCR 28 when it is in a conductive state.

The other difference in the embodiment of FIG. 3 is the provision of a separate floating power supply to provide more drive power for the SCR 28, if desired, than can be provided by the capacitor 70 of the embodiment of FIG. 1 during alternate half-cycles when the diode 66 would be nonconducting. The floating power supply of FIG. 3 comprises a transformer 120 of suitable voltage having its primary winding terminals connected directly across the line terminals 10 as shown, and its secondary winding terminals connected across a further full wave rectifier bridge 122 which provides a full wave rectified D.C. voltage across its output terminals 124 and 126. The negative output terminal 126 is connected directly to the reference circuit lead 24 so as to provide a common reference level for the circuit. The positive output terminal 124 of the bridge 122 is connected to a filter circuit comprising a series resistor 128 and a parallel connected capacitor 130. The output of the filter is supplied via lead 132 to the collector of transistor 64 through resistor 72. A further transistor 134, also of the NPN-type, is connected across the collector resistor 72 of the transistor 64 and is utilized to supply the higher gate currents to the SCR 28 through coupling resistor 136. Thus, with a command voltage $V_f$ which energizes the reed relay 34, closing contacts 34*a*, continuous or "hard" latching current is supplied to the SCR 28 which is essentially unlimited for practical purposes. Otherwise, the circuit illustrated in FIG. 3 operates in the manner previously described in connection with the embodiment of FIG. 1.

Thus, there has been described an improved synchronous switching circuit which has a positive latching feature, and maintains the switching thyristor or thristors conductive and operating synchronously with the line voltage for high current loads as well as for low current loads less than the latching current and even less than the minimum holding current of the device. The circuits will also operate effectively with reactive loads as has been described. Additionally, these switching thyristor operating circuits provide positive turn-on at every half-cycle, and thus prevent certain problems which may otherwise arise in the use of switching circuits which provide such turn-on at only every full cycle. For example, during turn-on, if the line voltage should drop because of a first half-cycle inrush of current, turn-on during the second half-cycle would probably not occur because of the resulting voltage drop to the circuit. Therefore, if the switching circuit did not provide a turn-on again until the next full cycle, a D.C. component typically 20 times greater than the load rms current may be produced with an inductive load. This increased current causes a still greater voltage drop and makes full cycle conduction impossible, resulting in the switching thyristor or series circuit breaker blowing. This undesirable sequence of events is not possible with circuits as described herein where such turn-on is provided at every half-cycle.

It is of course understood that although two particular embodiments of the present invention have been illustrated and described, various modifications thereof will be apparent to those skilled in the art; accordingly, the scope of the present invention should be defined only by the appended claims and equivalents thereof.

Various features of the invention are set forth in the following claims.

What is claimed is:

1. A switching circuit for controlling the application of an A.C. source to a load, comprising switching thyristor means having a pair of load terminals and a control terminal and having a bidirectional switching characteristic, said load terminals being connected in series with the A.C. source and the load, control thyristor means having a pair of load terminals and a control terminal, detector means for providing pulses indicative of the zero voltage crossings of said A.C. source, current supply means, means for selectively applying at least one of said pulses to the control terminal of said control thyristor means for triggering the same and for supplying continuous latching current thereto from said current supply means for succeeding cycles of said A.C. source once said control thyristor means becomes conductive, and means for coupling the control terminal of said switching thyristor means to one of said load terminals thereof through the load terminals of said control thyristor means.

2. The circuit of claim 1 wherein said coupling means comprises rectifier means for appropriately steering currents from the control terminal of said switching thyristor means, through said control thyristor means, to said one load terminal of said switching thyristor means for each polarity of the A.C. source.

3. The circuit of claim 2 wherein said rectifier means provides a rectified D.C. voltage for operating said detector means.

4. The circuit of claim 3 wherein said detector means comprises transistor means responsive to said rectified D.C. voltage to provide an output pulse whenever the rectified D.C. voltage is below the cut-off level of said transistor means, said output pulses being indicative of the zero voltage crossings of said source.

5. The circuit of claim 4 wherein said current supply means is also coupled to the output of said transistor means.

6. The circuit of claim 5 wherein said means for selectively applying said pulse and said latching current comprises a switch serially connecting the output of said transistor means to control terminal of said control thyristor means.

7. The circuit of claim 5 comprising circuit means for causing said transistor means to become nonconductive in response to said control thyristor becoming conductive.

8. The circuit of claim 2 wherein the load terminals of said control thyristor means are coupled across the output of said rectifier means.

9. The circuit of claim 8 wherein said rectifier means comprises a full wave bridge rectifier circuit having one input coupled to one terminal of said A.C. source and the other input coupled to the other terminal of the A.C. source and to the control terminal of said switching thyristor means.

10. A switching circuit for controlling the application of an A.C. source to a load, comprising switching thyristor means having a pair of load terminals and a control terminal and having a bidirectional switching characteristic, circuit means coupled to said load terminals for connecting the A.C. source to the load, control thyristor means having a pair of load terminals and a control terminal, detector means for providing a signal indicative of the zero voltage crossings of said A.C. source, means for, at will, enabling said control thyristor means to be responsive to said signal so that it is triggered into a conductive state at a zero voltage crossing of the source, means for supplying latching current to the control terminal of said control thyristor means for succeeding cycles of said A.C. source after said control thyristor means becomes conductive, and means for coupling the control terminal of said switching thyristor means to one of said load terminals thereof through the load terminals of said control thyristor means to maintain said switching thyristor means conductive.

11. The circuit of claim 10 comprising rectifier means for providing a full-wave rectified voltage to said detector means, said detector means including a transistor circuit having a transistor responsive to said rectified voltage for providing said signal when said rectified voltage is below the cut-off level of the transistor and said control thyristor means is enabled to be responsive to said signal.

12. The circuit of claim 11 wherein said rectifier means is also connected across the load terminals of said control thyristor means so that said transistor remains non-conductive when said control thyristor means becomes conductive, reducing the rectified voltage to the detector means below said cut-off level.

13. The circuit of claim 12 comprising means coupled to said transistor for supplying said latching current only when said transistor is nonconductive.

14. The circuit of claim 13 including means for applying said rectified voltage to the base circuit of said transistor, and means for applying said signal to the control terminal of said control thyristor means when said transistor becomes nonconductive.

15. The circuit of claim 14 comprising rectifier means for supplying said latching current to the control terminal of said control thyristor means when said transistor is nonconductive, the emitter and collector of said transistor being connected in shunt circuit relation to the control terminal of said control thyristor means and across said latching current supply.

16. A synchronous switching circuit for controlling the application of an A.C. source to a load, comprising a triac having an anode, cathode and gate; circuit means coupled to the triac anode and cathode for switching the A.C. source to the load when the triac is in its conductive state; a silicon controlled rectifier having an anode, cathode and gate; a rectifier circuit having four diodes interconnected in a general bridge arrangement to provide a pair of input terminals for the application of an A.C. voltage thereto and a pair of output terminals to provide a full-wave D.C. voltage therefrom; conductive means for coupling the A.C. source across said pair of input terminals, for coupling the triac gate to one of said input terminals, and for coupling the other of said input terminals to the triac anode; said pair of output terminals being connected across the anode and cathode of said silicon controlled rectifier and poled with respect to the diodes of said rectifier circuit so that a direct conductive path is provided between the gate and anode of the triac through the silicon controlled rectifier when the latter is in its conductive state; a transistor circuit having base input means connected across said pair of output terminals for rendering the transistor nonconductive when the full-wave D.C. voltage is below the cut-off level of the transistor, said cut-off level being sufficiently low so that the periods of nonconduction are indicative of the zero voltage crossings of the A.C. source; means coupled to the output of said transistor circuit and to the gate of the silicon controlled rectifier for selectively enabling the silicon controlled rectifier to be triggered into a conductive state at a zero voltage crossing of the A.C. source; and means coupled to the gate of the silicon controlled rectifier for supplying a latching signal thereto for succeeding cycles of the A.C. source after said silicon controlled rectifier becomes conductive.

17. The circuit of claim 16 wherein said means for providing a latching signal comprises means for providing a direct current derived from the A.C. source, and said output of said transistor circuit is interconnected with said immediately aforementioned means for permitting said latching current to be supplied to the gate of the silicon controlled rectifier only when said transistor is nonconductive.

* * * * *